United States Patent
Peng

(10) Patent No.: US 6,589,675 B2
(45) Date of Patent: Jul. 8, 2003

(54) ORGANIC ELECTRO-LUMINESCENCE DEVICE

(76) Inventor: Kuan-Chang Peng, No. 8, Lane 213, Sec. 2, Jingguo Rd., Hsinchu (TW), 300

( * ) Notice: Subject to any disclaimer, the term of this patent is extended or adjusted under 35 U.S.C. 154(b) by 74 days.

(21) Appl. No.: 09/986,849

(22) Filed: Nov. 13, 2001

(65) Prior Publication Data

US 2003/0091858 A1 May 15, 2003

(51) Int. Cl.⁷ .............................................. H05B 33/04
(52) U.S. Cl. ...................... 428/690; 428/917; 313/506; 313/512
(58) Field of Search ..................... 428/690, 917; 313/506, 512

(56) References Cited

U.S. PATENT DOCUMENTS

| | | | |
|---|---|---|---|
| 4,213,074 A | * 7/1980 | Kawaguchi et al. | 313/509 |
| 5,189,405 A | * 2/1993 | Yamashita et al. | 340/781 |
| 5,595,924 A | * 1/1997 | Yuan et al. | 437/43 |
| 5,661,364 A | * 8/1997 | Kruskopf | 313/512 |
| 5,811,177 A | * 9/1998 | Shi et al. | 428/209 |
| 5,874,804 A | * 2/1999 | Rogers | 313/512 |
| 5,882,761 A | * 3/1999 | Kawami et al. | 428/69 |
| 5,962,962 A | * 10/1999 | Fujita et al. | 313/412 |
| 6,081,071 A | * 6/2000 | Rogers | 313/512 |
| 6,160,346 A | * 12/2000 | Vleggaar et al. | 313/512 |

FOREIGN PATENT DOCUMENTS

| | | | |
|---|---|---|---|
| JP | 05-041281 | * | 2/1993 |
| JP | 05-114486 | * | 5/1993 |
| WO | WO 94/15350 | * | 7/1994 |

* cited by examiner

Primary Examiner—Cynthia H. Kelly
Assistant Examiner—Dawn Garrett
(74) Attorney, Agent, or Firm—Rosenberg, Klein & Lee

(57) ABSTRACT

The present invention discloses an organic electro-luminescence device, comprising: a substrate; at least one transparent electrode on the surface of the substrate; an organic layer, comprising at least one organic emitting layer, formed on the surface of the transparent electrode; an opposed electrode, formed on the organic layer; a sealing case, attached to the surface of the substrate by a inner sealing pad, thereby forming an inner gap to surround and isolate the organic layer and the opposed electrode; and a sealing ring, disposed in the periphery of the sealing case, attached to the surface of the substrate by a bottom sealing pad and attached to the sidewall of the sealing ring with a lateral ring body of the sealing ring by a side sealing pad; wherein there is a drying substance disposed in a compartment enclosed by the sealing ring.

14 Claims, 6 Drawing Sheets

ORGANIC ELECTRO-LUMINESCENCE DEVICE

BACKGROUND OF THE INVENTION

1. Field of the Invention

The present invention generally relates to an improved structure of an organic electro-luminescence (to be abbreviated as "EL" hereinafter) device, characterized in that a compartment is disposed in the periphery of a sealing case surrounding an organic layer and an opposed electrode. In the compartment, there is disposed a drying substance for moisture absorption, so as to prevent the generation of dark spots and prolong the lifetime of the device.

2. Description of the Prior Art

The organic EL device has attracted tremendous attention due to its advantages over other display panels. These advantages include a larger visual angle, shorter response time, a smaller dimension in thickness, lower power consumption, simpler fabrication, no need for backlighting, and the ability for light emitting in a full color range.

Please refer to FIG. 1, which is a cross-sectional view showing the structure of an organic EL device in accordance with the prior art. The organic EL device is characterized in that a transparent electrode 12 is formed on a substrate 11, and on the transparent electrode 12 there are an organic layer 13 which comprises a hole injection layer, a hole transport layer, an organic emitting layer or an electron transport layer, an opposed electrode 14 and an sealing case 15, where all the layers in the organic layer 13 are formed by evaporation in turn. Since in an organic EL device the light is generated when the electrons and holes from the transparent electrode 12 and opposed electrode 14 combine in the organic layer 13 to excite the organic emitting layer, it is inevitable that heat is generated during the luminescence process. Once the heat encounters the moisture existing inside the sealing case 15, dark spots due to oxidation will be formed on the surface of the organic layer 13. The existence of such dark spots adversely affects the luminescence qualities such as luminescence intensity and luminescence uniformity of an organic EL device. More seriously, the lifetime of an organic EL device may be substantially shortened.

In order to overcome the image defects due to the undesirable dark spots, some companies have developed a number of prior art organic EL displays to improve the image quality. For example, in the Japanese Patent Nos. JP-A-363890 and JP-A-5-114486, it is disclosed that liquid fluorinated carbon is disposed inside the sealing case 15 to effectively remove the heat generated during the luminescence process. In the Japanese Patent No. JP-A-5-41281, it is disclosed that dehydrating agents such as a synthetic zeolite are mixed in the liquid fluorinated carbon to effectively remove the moisture existing in the periphery of the device. Moreover, in the U.S. Pat. No. 5,962,962, entitled "Method of encapsulating organic electroluminescence device and organic electroluminescence device", it is disclosed that a silicone oil or a silicone grease is used as a protective liquid to remove the existing moisture.

The above prior arts can reduce the generation of dark spots to some extent; however, the dehydrating agents such as liquid fluorinated carbon may add difficulty to the fabrication process, which is unfavorable for fabrication integration and reduction in cost.

Accordingly, a second prior art structure of an organic EL device is proposed as shown in FIG. 2. In the U.S. Pat. No. 5,882,761, entitled "Organic EL element", it is disclosed that a drying substance 17 is attached to the inner surface of a sealing case 15 showing a sealing agent 18 and an internal space 19 is formed between the drying substance 17 and an opposed electrode 14. The solid-state drying substance 17 absorbs the moisture existing inside the sealing case 15, so as to prevent the generation of dark spots.

Even though the U.S. Pat. No. 5,882,761 can overcome some of the problems in the prior arts, it still has the following drawbacks:

1. The drying substance is attached in the direction right above the organic layer and the opposed electrode. Therefore, when the device is hit against an external force, the drying sbustance may fall off and directly hit the organic layer or the opposed electrode. In this case, the device will damage.
2. The drying substance is attached in the direction right above the organic layer and the opposed electrode. In addition, there must be a vertical gap between the drying substance and the opposed electrode. Therefore, the total height is increased, which becomes a limit when it comes to designing a downsized device.

SUMMARY OF THE INVENTION

Therefore, the present invention has been made to solve such problems in view of the forgoing status and to further provide an improved structure of an organic electro-luminescence (EL) device, incorporating a sealing case that can effectively prevent the damage when being hit by an external force and prevent the generation of dark spots, so as to prolong the lifetime of the device.

It is the primary object of the present invention to provide an improved structure of an organic EL device, in which there is disposed a drying substance in a compartment in the periphery of the sealing case to absorb the moisture around the organic layer, so as to prevent the generation of dark spots and prolong the lifetime of the device.

It is another object of the present invention to provide an improved structure of an organic EL device, in which a drying substance is stored in a compartment that is distant from the perpendicular direction to the organic layer, so that the drying substance does not hit the organic layer when it falls off due to an external force. In this case, the probability that the organic layer is damaged is lowered.

It is still another object of the present invention to provide an improved structure of an organic EL device, in which a drying substnace is disposed in a non-perpendicular direction to the organic layer, so that there is not necessarily a vertical gap between the drying substance and the opposed electrode. Therefore, the total height is decreased, which is favorable when it comes to designing a downsized device.

It is still another object of the present invention to provide an improved structure of an organic EL device, in which a drying substance is disposed in a non-perpendicular direction to the organic layer, so that whether the drying substance may fall off and directly hit the organic layer or the opposed electrode does not become the key issue concerning the lifetime of the device. In this case, the fabrication process can be simplified.

In order to achieve the foregoing objects, the present invention provides an organic EL device, comprising: a substrate; at least one transparent electrode on the surface of said substrate; an organic layer, comprising at least one organic emitting layer, formed on the surface of said transparent electrode; an opposed electrode, formed on said organic layer; a sealing case, attached to the surface of said substrate by a inner sealing pad, thereby forming an inner gap to surround and isolate said organic layer and said opposed electrode; and a sealing ring, disposed in the periphery of said sealing case, attached to the surface of said substrate by a bottom sealing pad and attached to the sidewall of said sealing ring with a lateral ring body of said sealing ring by a side sealing pad; wherein there is a drying substance disposed in a compartment enclosed by said sealing ring.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an improved structure of an organic EL device, which prevents the generation of undesired dark spots and prolong the lifetime of the device, can be exemplified by the preferred embodiments as described hereinafter.

Figure 1:
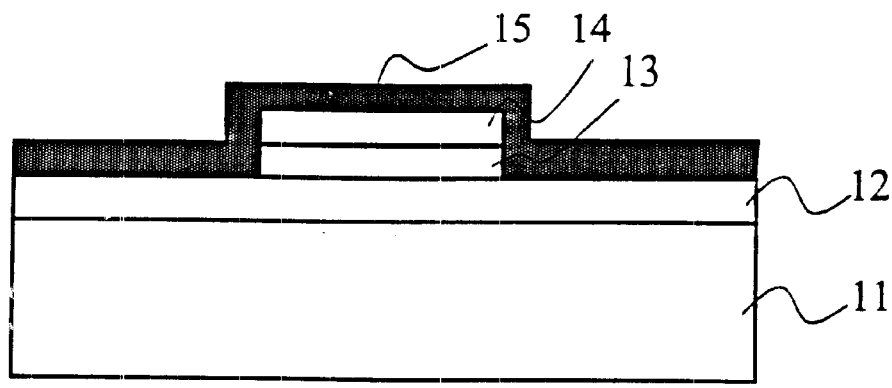
FIG. 1 is a cross-sectional view showing the structure of an organic EL device in accordance with the prior art.
Figure 2:
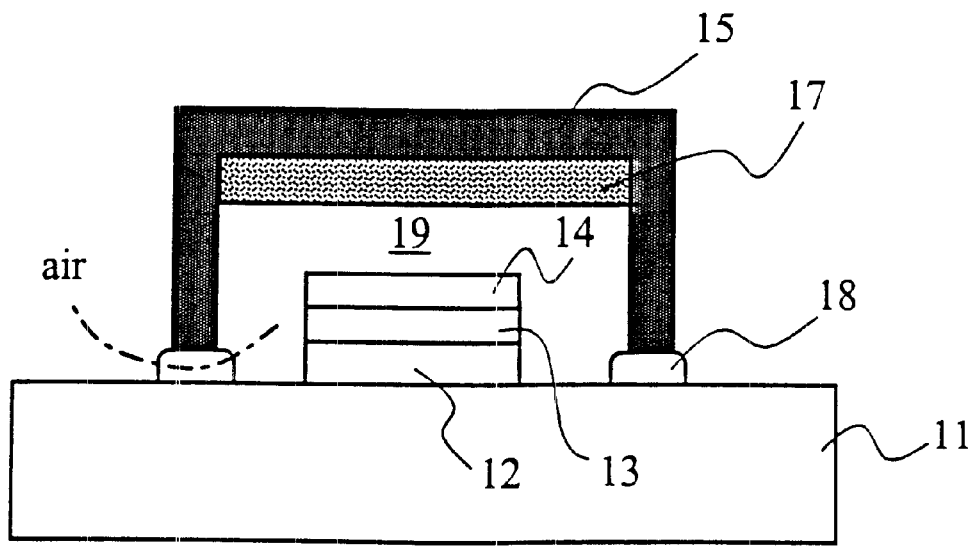
FIG. 2 is a cross-sectional view showing the structure of another organic EL device in accordance with the prior art.
Figure 3A:
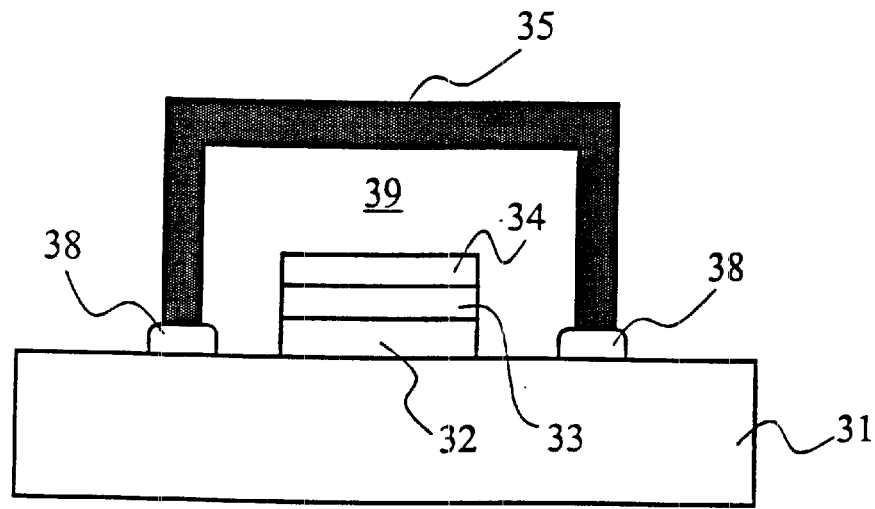
FIG. 3A to FIG. 3C are cross-sectional views showing the structure of an organic EL device in manufacturing steps in accordance with one embodiment of the present invention.
Figure 3B:
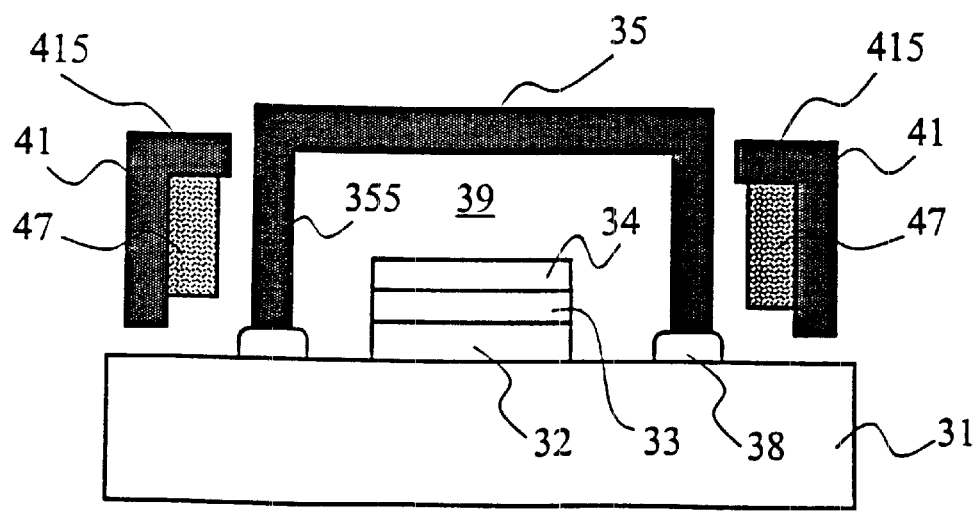
Figure 3C:
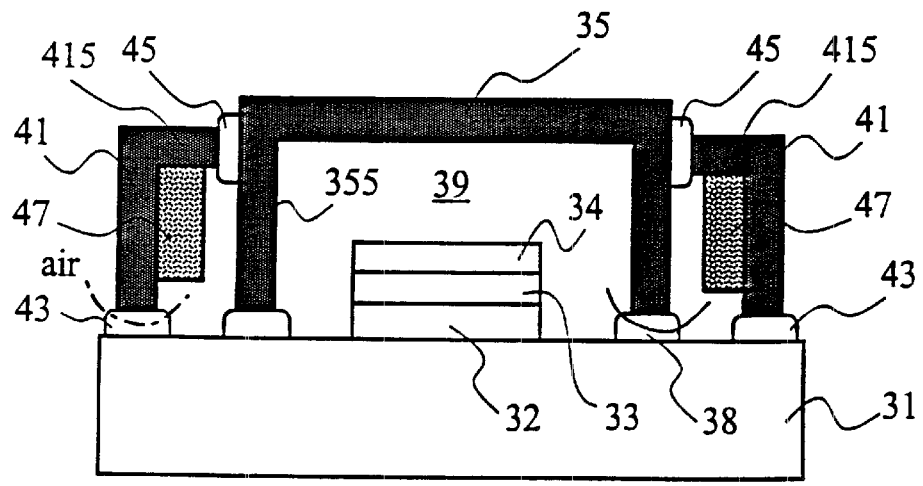

To start with, please refer to FIG. 3A to FIG. 3C, which are cross-sectional views showing the structure of an organic EL device in manufacturing steps in accordance with one embodiment of the present invention. As shown in the figures, the organic EL device comprises: a substrate 31; at least one transparent electrode 32 formed of a transparent material (such as ITO, IZO, or other transparent thin metal films) on the surface of the substrate 31; an organic layer 33, comprising at least one organic emitting layer, formed by evaporation or sputtering on the surface of the transparent electrode 32; and an opposed electrode 34, formed by evaporation or sputtering on the organic layer 33.

The organic EL device in accordance with the present embodiment further comprises: a sealing case 35, attached to the surface of the substrate 31 by an inner sealing pad 38, thereby forming an inner gap 39 to surround and isolate the organic layer 33 and the opposed electrode 34 from the external moisture (as shown in FIG. 3A); and a sealing ring 41, disposed in the periphery of the sealing case 35 (as shown in FIG. 3B), attached to the surface of the substrate 31 by a bottom sealing pad 43 and attached to the sidewall of the sealing case 35 with the lateral ring body 415 of the sealing ring 41 by the side sealing pad 45, wherein there is a drying substance 47 disposed in a compartment enclosed by the sealing ring 41 (as shown in FIG. 3C).

The drying substance 47 is composed of one of PSG, BPSG, BSG, alkaline earth metal oxides, alkaline metal oxide compounds, sulfates, metal halides, perchlorates, polymers and any of their combinations. Such materials can chemically absorb the moisture and never release the moisture back, so that the sealing case 35 is kept dehumidified.

Therefore, when the external moisture penetrates the sealing pad 43 (as illustrated by the arrow shown in FIG. 3C) and enters the compartment enclosed by the sealing ring 41, the external moisture is chemically absorbed by the drying substance 47. In this case, the external moisture has little chance to further penetrate the inner sealing pad 38 and enter the sealing case 35. Therefore, the organic layer 33 is protected from being oxidized so that the luminescence quality is ensured and the lifetime of the device is prolonged. Certainly, some moisture generated during the fabrication process and existing inside the sealing case can also penetrate the sealing pad 38 and be absorbed by the drying substance 47.

On the other hand, the drying substance 47 is disposed in a non-perpendicular direction to the organic layer 33 or the opposed electrode 34, so that the drying substance 47 does not hit the organic layer 33 or the opposed electrode 34 when it falls off from the inner surface of the sealing ring 41 due to an external force. Is this case, the probability that the organic layer is damaged is lowered.

Figure 4:
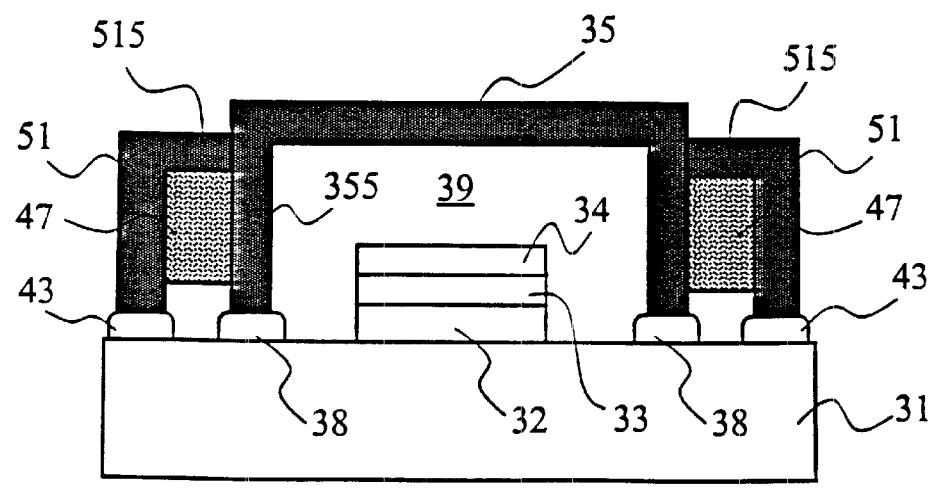
FIG. 4 is a cross-sectional view showing the structure of an organic EL device in accordance with another embodiment of the present invention.

Please further refer to FIG. 4, which is a cross-sectional view showing the structure of an organic EL device in accordance with another embodiment of the present invention. As shown in the drawing, this embodiment is characterized in that the lateral ring body 515 of the sealing ring 51 is attached to the sidewall of the sealing case 35 without incorporating the side sealing pad 45 as shown in FIG. 3C.

Figure 5:
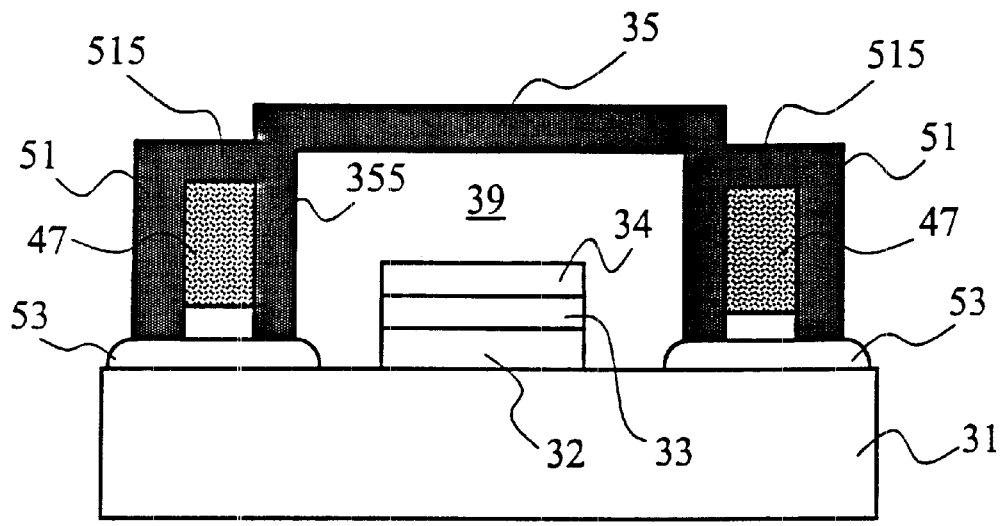
FIG. 5 is a cross-sectional view showing the structure of an organic EL device in accordance with still another embodiment of the present invention.

Furthermore, as shown in FIG. 5, which is a cross-sectional view showing the structure of an organic EL device in accordance with another embodiment of the present invention, the sealing ring 51 can be formed of the same material as the sealing case 35 or even by the same step of fabrication process. The sealing pads 38, 43 as shown in FIG. 3C and FIG. 4 can be replaced with a sealing pad 53.

Figure 6:
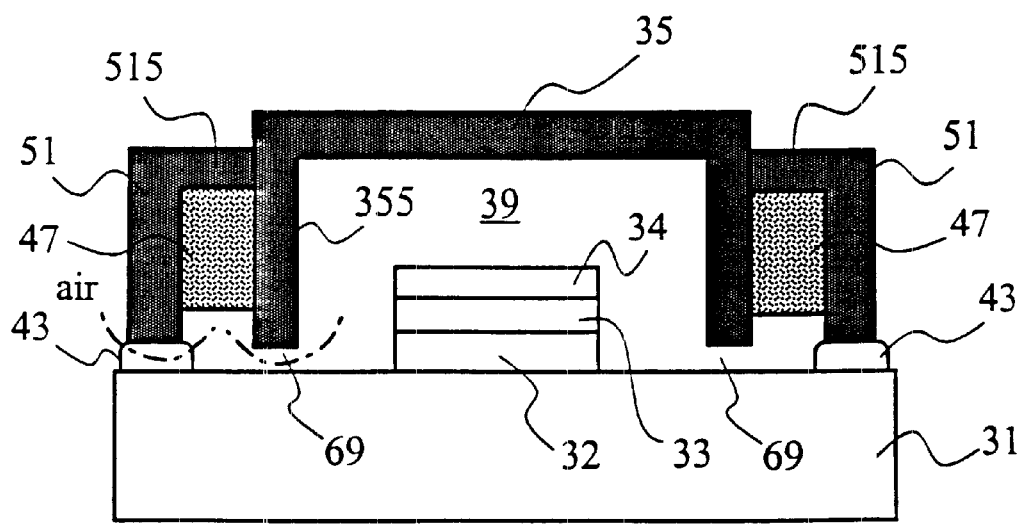
FIG. 6 is a cross-sectional view showing the structure of an organic EL device in accordance with still another embodiment of the present invention.

Certainly, as shown in FIG. 6, which is a cross-sectional view showing the structure of an organic EL device in accordance with another embodiment of the present invention, the part of the sealing pad 53 at the bottom of the sealing case 35 can be omitted while only the part of the sealing pad 43 at the bottom of the sealing ring 51 is preserved. In this case, an absorption channel 69 is formed to facilitate the moisture existing in the sealing case 35 to be absorbed by the drying substance 47.

Figure 7:
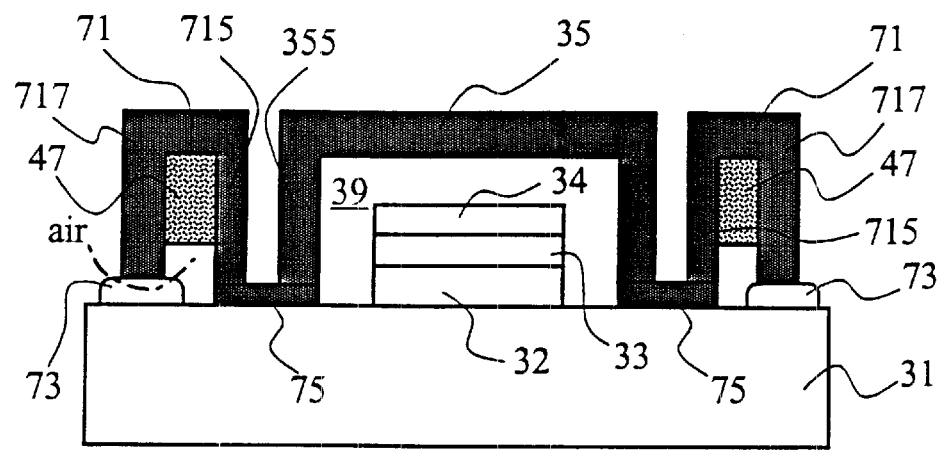
FIG. 7 is a cross-sectional view showing the structure of an organic. EL device in accordance with still another embodiment of the present invention.

Please refer to FIG. 7, which is a cross-sectional view showing the structure of an organic EL device in accordance with another embodiment of the present invention. As shown in the drawing, this embodiment is characterized in that the sealing ring 51 (as shown in FIGS. 4, 5 and 6) is replaced by a sealing ring 71 isolated from the sealing case 35. An inner sidewall 715 of the sealing ring 71 is connected to the bottom part of the sidewall 355 of the sealing case 35 by an interconnecting layer 75. The interconnecting layer 75 is directly attached to the surface of the substrate 31.

Moreover, an outer sidewall 717 of the sealing ring 71 is attached to the surface of the substrate 31 by a sealing pad 73. Enclosed by the inner sidewall 715 and the outer sidewall 717 of the sealing ring 71 is a compartment, in which a drying substance 47 is disposed to absorb the moisture.

Figure 8:
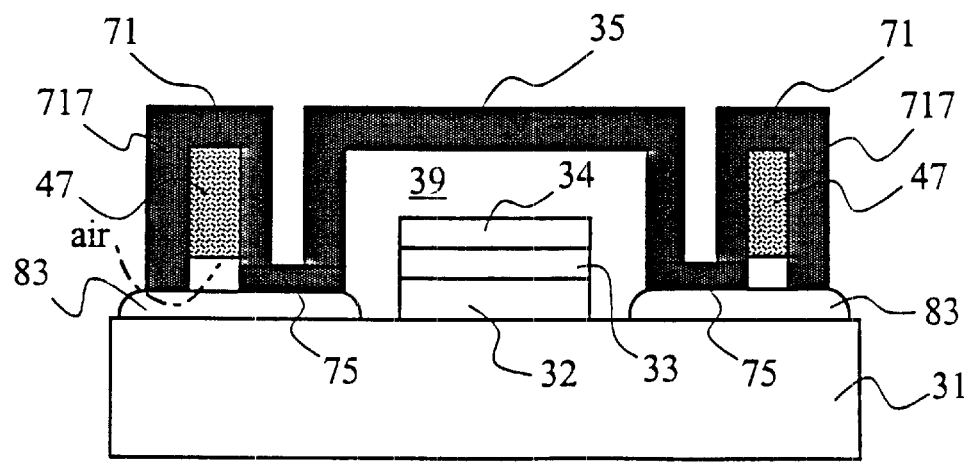
FIG. 8 is a cross-sectional view showing the structure of an organic EL device in accordance with still another embodiment of the present invention.

Furthermore, please refer to FIG. 8, which is a cross-sectional view showing the structure of an organic EL device in accordance with another embodiment of the present invention. As shown in the drawing, this embodiment is characterized in that both of the interconnecting layer 75 (as shown in FIG. 7) and the outer sidewall 717 of the sealing ring 71 are attached to the surface of the substrate 31 by a bottom sealing pad 83.

Figure 9:
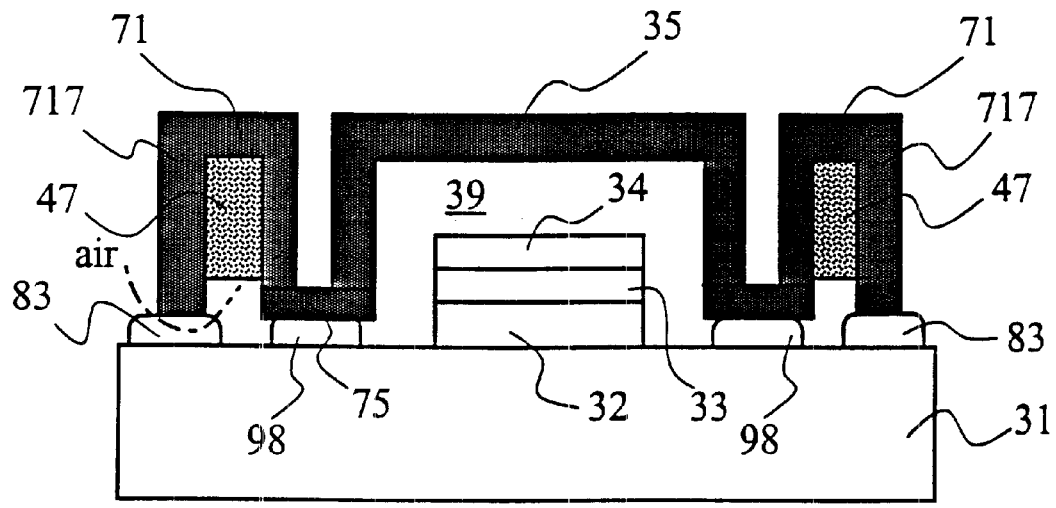
FIG. 9 is a cross-sectional view showing the structure of an organic EL device in accordance with still another embodiment of the present invention.

Furthermore, please refer to FIG. 9, which is a cross-sectional view showing the structure of an organic EL device in accordance with another embodiment of the present invention. As shown in the drawing, this embodiment is characterized in that the bottom sealing pad 83 (as shown in FIG. 8) is divided into two sealing pads 83 and 98.

Figure 10:
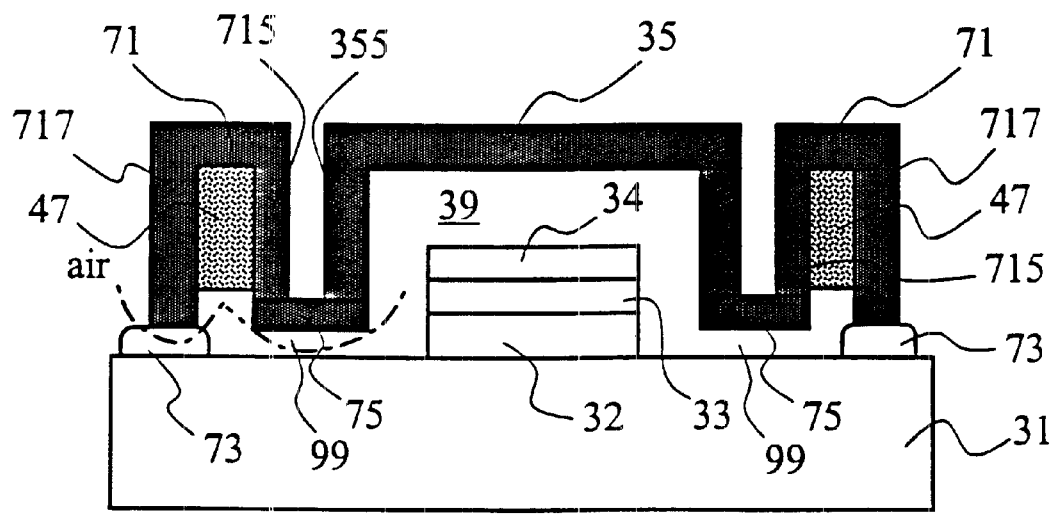
FIG. 10 is a cross-sectional view showing the structure of an organic EL device in accordance with still another embodiment of the present invention.

Furthermore, please refer to FIG. 10, which is a cross-sectional view showing the structure of an organic EL device in accordance with another embodiment of the present invention. As shown in the drawing, this embodiment is characterized in that the sealing pad 98 (as shown in FIG. 9) is omitted, forming an absorption channel 99.

According to the above discussion, the present invention discloses an improved structure of an organic electro-luminescence device, characterized in that a compartment is disposed in the periphery of a sealing case surrounding an organic layer and an opposed electrode. In the compartment there is disposed a drying subsatnce for moisture absorption, so as to prevent the generation of dark spots and prolong the lifetime of the device. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An organic electro-luminescence (EL) device, comprising:
   a substrate;
   at least one transparent electrode on the surface of said substrate;
   an organic layer, comprising at least one organic emitting layer, formed on the surface of said transparent electrode;
   an opposed electrode, formed on said organic layer;
   a sealing case, attached to the surface of said substrate by a inner sealing pad, thereby forming an inner gap to surround and isolate said organic layer and said opposed electrode; and
   a sealing ring, disposed in the periphery of said sealing case, attached to the surface of said substrate by a bottom sealing pad and attached to the sidewall of said sealing case—was inserted in its with a lateral ring body of said sealing ring by a side sealing pad;
   wherein there is a drying substance disposed in a compartment enclosed by said sealing ring.

2. The organic EL device as recited in claim 1, wherein said lateral ring body of said sealing ring is directly attached to the sidewall of said sealing case.

3. The organic EL device as recited in claim 2, wherein said sealing ring is formed of the same material as said sealing case.

4. The organic EL device as recited in claim 1, wherein said inner sealing pad at the bottom of said sealing case and said bottom sealing pad at the bottom of said sealing ring are combined as one sealing pad.

5. The organic EL device as recited in claim 1, wherein said inner sealing pad at the bottom of said sealing case is replaced by an absorption channel formed between the surface of said substrate and the bottom of said sealing case.

6. The organic EL device as recited in claim 1, wherein said drying substance is composed or a combination from the group consisting of one of PSG, BPSG, BSG, alkaline earth metal oxides, alkaline metal oxide compounds, sulfates, metal halides, perchlorates, and polymers.

7. An organic electro-luminescence (EL) device, comprising:
   a substrate;
   at least one transparent electrode on the surface of said substrate;
   an organic layer, comprising at least one organic emitting layer, formed on the surface of said transparent electrode;
   an opposed electrode, formed on said organic layer;
   a sealing case, directly attached to the surface of said substrate, thereby forming an inner gap to surround and isolate said organic layer and said opposed electrode; and
   a sealing ring, disposed in the periphery of said sealing case, attached to the surface of said substrate by a bottom sealing pad and attached to the sidewall of said sealing case with the bottom of an inner sidewall of said sealing ring by an interconnecting layer,
   wherein there is a drying substance disposed in a compartment enclosed by said sealing ring.

8. The organic EL device as recited in claim 7, wherein said interconnect layer is directly attached to the surface of said substrate.

9. The organic EL device as recited in claim 7, wherein an inner sealing pad is formed between the surface of said substrate and the bottom surface of said interconnect layer.

10. The organic EL device as recited in claim 9, wherein said inner sealing pad and said bottom sealing pad are combined as one sealing pad.

11. The organic EL device as recited in claim 9, wherein said inner sealing pad is replaced with an absorption channel formed between the surface of said substrate and the bottom surface of said interconnecting layer.

12. The organic EL device as recited in claim 11, wherein the thickness of said drying substance is larger than the height of said absorption channel.

13. The organic EL device as recited in claim 7, wherein said sealing case, said interconnect layer and said sealing ring are formed by the same material.

14. The organic EL device as recited in claim 7, wherein said drying substance is composed of one or a combination from the group consisting—was inserted after of PSG, BPSG, BSG, alkaline earth metal oxides, alkaline metal oxide compounds, sulfates, metal halides, perchlorates, and polymers.

* * * * *